United States Patent
Colwell et al.

(10) Patent No.: US 7,945,890 B2
(45) Date of Patent: May 17, 2011

(54) REGISTRY FOR ELECTRONIC DESIGN AUTOMATION OF INTEGRATED CIRCUITS

(75) Inventors: Regis Colwell, Gibsonia, PA (US); Gilles S. C. Lamant, Sunnyvale, CA (US); Alisa Yurovsky, Pittsburgh, PA (US); Timothy Rosek, Gibsonia, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 698 days.

(21) Appl. No.: 11/932,062

(22) Filed: Oct. 31, 2007

(65) Prior Publication Data
US 2009/0113369 A1 Apr. 30, 2009

(51) Int. Cl.
*G06F 17/50* (2006.01)

(52) U.S. Cl. .......................... 716/139; 716/100; 716/102

(58) Field of Classification Search .................. None
See application file for complete search history.

(56) References Cited

U.S. PATENT DOCUMENTS

| | | | | |
|---|---|---|---|---|
| 5,510,998 | A * | 4/1996 | Woodruff et al. | 716/11 |
| 6,177,942 | B1 * | 1/2001 | Keong et al. | 715/810 |
| 7,003,749 | B2 * | 2/2006 | Subasic et al. | 716/10 |
| 7,024,636 | B2 * | 4/2006 | Weed | 716/1 |
| 2002/0156757 | A1 * | 10/2002 | Brown | 707/1 |

OTHER PUBLICATIONS

Cottrell et al., "Interoperability Beyond Design: Sharing Knowledge between Design and Manufacturing", Proc. of the Fourth Int'l Symposium on Quality Electronic Design (ISQED'03), 2003 IEEE, 6 pages.*

Blanchard et al., "The OpenAccess Coalition—The Drive to an Open Industry Standard Information Model, API, and Reference Implementation for IC Design Data", Proc. of the Int'l Symposium on Quality Electronic Design (ISQED'02), 2002 IEEE, 6 pages.*

Pack et al., "GDS-3 Initiative: Advanced Design-through-Chip Infrastructure for Sub-Wavelength Technology", Design, Process Integration, and Characterization of Microelectronics, Proc> of SPIE vol. 4692 (2002), pp. 566-584.*

Gatziu et al., "SAMOS: An Active Object-Oriented Database System," to appear in IEEE Quarterly Bulletin on Data Engineering, Jan. 1993, 5 pages.*

Munro et al., "Direct Manipulation Authoring of Object Behavior in an Interactive Graphical Modeling Environment," 1990 IEEE, 3 pages.*

Grebinski, "The Anatomy of a Universal Data Model," $22^{nd}$ Annual BACUS Symposium on Photomask Technology, Proc. of SPIE vol. 4889 (2002), pp. 127-136.*

Vaduva et al., "Graphical Tools for Rule Development in the Active DBMS SAMOS", 1997 IEEE, pp. 587.*

Guiney et al., "An Introduction to OpenAccess—An Open Source Data Model and API for IC Design," 2006 IEEE, pp. 434-436.*

Mallis, D., et al., *OpenAccess™ Release 2.2 Standard: API Tutorial, Fifth Edition*, Table of Contents and Chapters 1 & 20, Silicon Integration Initiative, Inc., Austin, TX, (2007), 114 pgs.

* cited by examiner

*Primary Examiner* — Leigh Marie Garbowski
(74) *Attorney, Agent, or Firm* — Schwegman, Lundberg & Woessner, P.A.

(57) ABSTRACT

A method for registering constraints for EDA (Electronic Design Automation) of an IC (Integrated circuit) includes: associating a constraint with values for constraint identification that identify the constraint in an IC design; associating the constraint with values for constraint relationships that relate the constraint to at least one EDA application; saving the constraint identification values and the constraint relationship values in a constraint registry element; and providing an interface to a user for accessing values of the constraint registry element.

21 Claims, 8 Drawing Sheets

| Field | Sample Value | Description |
|---|---|---|
| ShowInApps | "PRE" "SKILL" | Which applications support this constraint |
| categoryInApps | "Routing" | An indication that a constraint type belongs to a class of similar constraint types so a user interface may group them |
| oaConstraintDefName | "oaTaperHalo" | Which constraint type in the database is represented here |
| allowedValueTypes | nil | Which value types the applications support on this constraint type, overrides what the database supports |
| contextObjectType | "Nets" | Which design objects support this constraint type |
| contextConstraintGroup Type | "InputTaper" "outputTaper" | Which design constraint groups support this constraint type |
| contextGUIName | "Taper Halo" | How GUIs Clients should refer to this constraint type |
| contextName | "taperHalo" | How non-GUI Clients should refer to this constraint type |
| GUIDescription | "Specifies the offset around pin figures within which tapering must be performed according to the spacing and width constraints specified in the taper constraint group" | Text for a tool tip or similar GUI element to be used with this constraint. |
| GUIImage | "dfII/ci/processRules/images/figTaperHalo.png" | A pointer to an image file representing this constraint type |
| valueDisplay | "UU" | A scaling factor for values on this constraint type |
| suggestedMaterials | nil | If this constraint type is associated with layers then a suggestion to which layers it should be used on. |
| allowedParams | nil | A list of parameters which are supported on this constraint type |

FIG. 3

REGISTRY FOR ELECTRONIC DESIGN AUTOMATION OF INTEGRATED CIRCUITS

BACKGROUND OF THE INVENTION

1. Field of Invention

The present invention relates to integrated circuits (ICs) and more particularly to Electronic Design Automation (EDA) of ICs.

2. Description of Related Art

Today's deep sub-micron process present ever-increasing challenges to engineers working on full custom analog and digital designs for ICs. As the process node feature sizes become smaller, the number and complexity of the design constraints (also known as design rules and process constraints) increase. With this increased complexity, the need for assistance and/or automation to aid the engineer becomes more and more essential.

EDA companies are rapidly adopting OpenAccess (OA), which is a community-driven initiative that provides an interoperability platform for complex IC design based on a common, open, and extensible architecture. OA provides an open standard application programming interface (API) and reference database implementation supporting that API.

Design constraints are defined in the technology database (techDB), and can later be overridden in OA-supporting EDA tools. Common use of overrides is specifying a different set of design constraints on a per object basis, such as specifying allowable layers and widths for a particular net. In this context EDA tools and applications must provide a friendly interface to allow the user to create a local override on a given object (such as a net). Presenting the user with all the existing design constraints is prohibitively complicated and confusing—OA has over 100 different design constraints, and in addition allows applications to define their own.

However, conventional EDA applications and systems do not allow users to access relevant constraint information in a flexible way (e.g., for pruning the design constraints so that the user's interface is not cluttered by irrelevant constraints). Thus, there is a need for a registry for EDA applications that allows users to access constraint information in the process of IC design.

SUMMARY OF THE INVENTION

In one embodiment of the present invention, A method for registering constraints for Electronic Design Automation (EDA) of an Integrated Circuit (IC) includes: associating a constraint with values for constraint identification that identify the constraint in an IC design; associating the constraint with values for constraint relationships that relate the constraint to at least one EDA application; saving the constraint identification values and the constraint relationship values in a constraint registry element; and providing an interface to a user for accessing values of the constraint registry element.

According to one aspect of this embodiment, the constraint identification values may include values for at least one of a name, a description, an image, or a scale.

According to another aspect, the constraint relationship values may include values for at least one of an EDA application, a design object, or a design constraint group.

According to another aspect, the method may further include providing an interface to an EDA application developer for editing values in the constraint registry element.

According to another aspect, the method may further include providing an interface to an EDA database that stores the IC design for transferring values from the EDA database to the constraint registry element.

According to another aspect, the method may further include providing an interface between the user and an EDA database that stores the IC design for editing the IC design while accessing values from the constraint registry element.

According to another aspect, providing the interface to the user may include organizing a display of constraints according to groupings of constraints and availability of editing by the user.

According to another aspect, the method may further include mapping user inputs to values of the constraint registry element and corresponding values of the IC design and displaying mapping results to the user.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer. In these ways the present invention enables a registry for EDA applications that allows users to access constraint information in the process of IC design.

BRIEF DESCRIPTION OF THE DRAWINGS

FIG. 3 shows details for an exemplary registry entry according to an embodiment of the present invention.

DETAILED DESCRIPTION OF EXEMPLARY EMBODIMENTS

Figure 1:
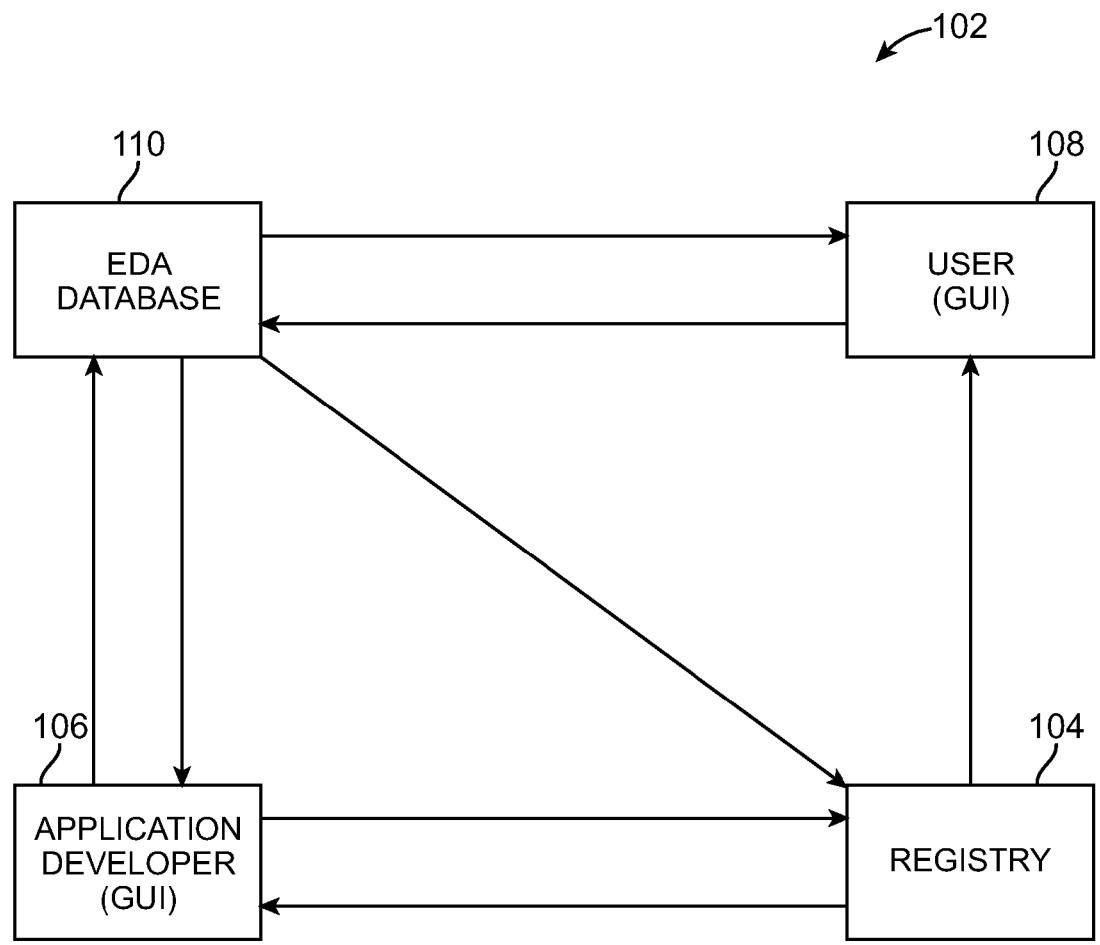
FIG. 1 shows an exemplary system for IC design according to an embodiment of the present invention.

An embodiment of the present invention is shown in FIG. 1. A system 102 for EDA (Electronic Design Automation) of an IC (Integrated circuit) includes a registry 104 that stores registry elements with values for constraints of an IC design. As discussed below in greater detail, these constraint values may identify the specific parameters of the constraint and relate the constraint with specific EDA applications where the constraint is relevant. An application developer 106, who specifies constraints for an EDA application or otherwise tailors the application for a user, has access to the registry through a GUI (graphical user interface) to view and edit the registry elements. A user 108 has access through a GUI to the registry for viewing the related constraint information. Typically, the user 108 also has access to an EDA database 110 that stores the IC design (e.g., specification for layout and routing) so that the user 108 can view and edit the IC design (e.g., through the EDA application corresponding to the application developer 106) while accessing the registry 104. The application developer 106 may also have access to the EDA database 110 for viewing and editing the IC design. Additionally, there may be an interface between the EDA database 110 and the registry 104 so that values from the database 110 can be transferred directly to the registry 104.

The above-described system 102 facilitates EDA design by enabling a user to access registry information for a constraint while making related design changes. For example an exemplary method for registering EDA constraints for an IC includes: associating a constraint with values for constraint identification that identify the constraint in an IC design; associating the constraint with values for constraint relationships that relate the constraint to at least one EDA application; saving the constraint identification values and the constraint relationship values in a constraint registry element; and providing an interface to a user for accessing values of the constraint registry element. For example, the constraint identification values may include values for a name, a description, an image, or a scale, and the constraint relationship values may include values for an EDA application, a design object, or a design constraint group. The application developer 106 may tailor the user's access to the database 110 and the registry 104 so that the user 108 can access relevant constraint information in the registry 104 when editing the design in then database 110. In some operational settings the database 110 may be a standard database such as OpenAccess where access is available to multiple parties in the design process.

Figure 2:
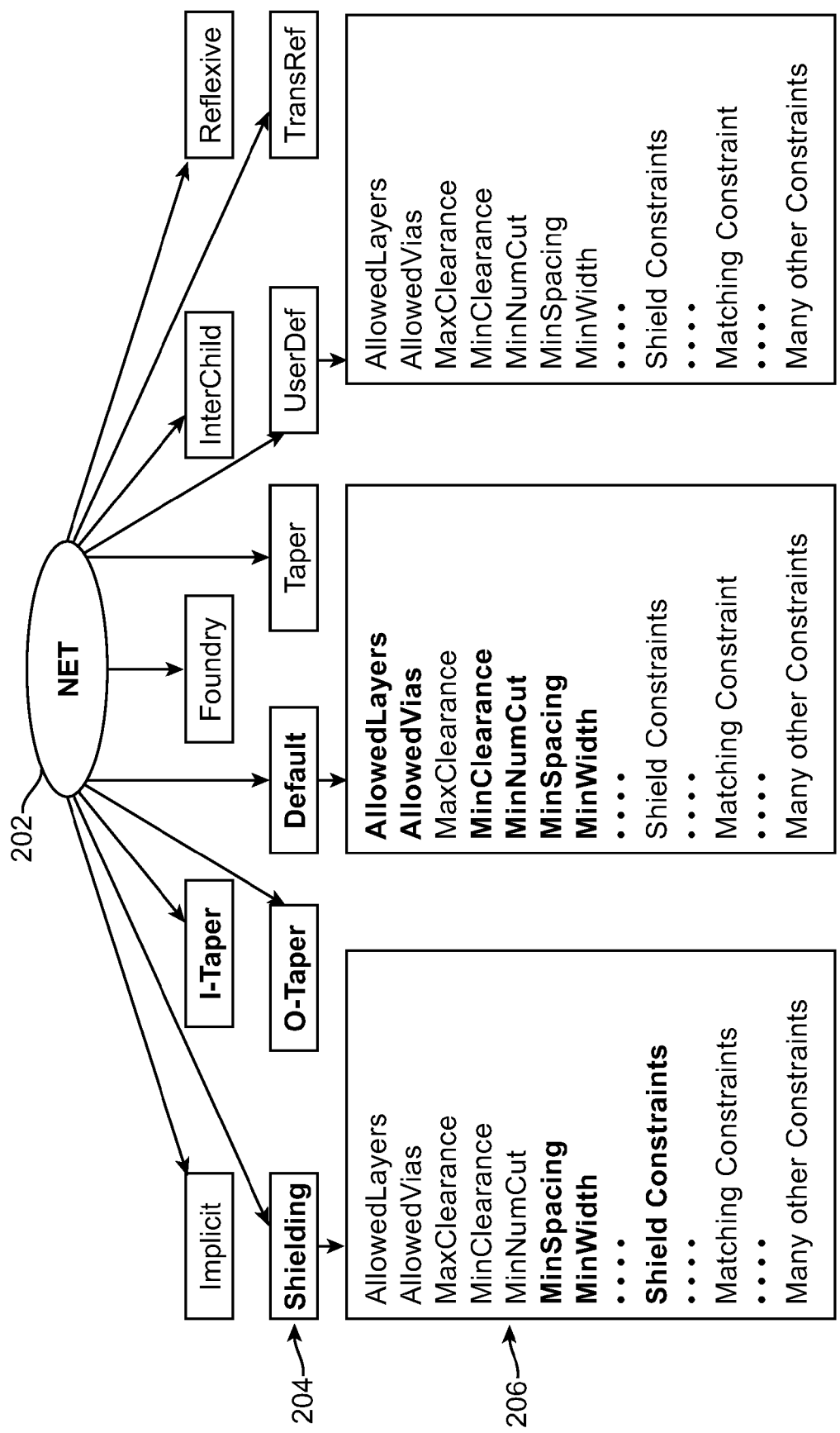
FIG. 2 shows exemplary tree-structure for EDA constraint information according to an embodiment of the present invention.

FIG. 2 shows an exemplary tree-structure for constraint information that includes design object types 202 (e.g., NET), constraint group types 204 (e.g., Shielding), and constraint types 206 (e.g., MinSpacing). Inside the boxes showing the constraint types 206, the valid constraint types (e.g., allowed by the application developer 106) are denoted by darker shading (e.g., MinSpacing) and invalid constraint types (e.g. not allowed by the application developer 106) are denoted by lighter or gray shading (e.g., MinNumCut). Note that valid constraint types 206 can be specified by enumeration or other equivalent means (e.g., a semantical specification by key words).

Valid combinations are specified in the registry. For example, in this case the relevant applications have not registered any valid constraint types on a Net 202 in the implicit constraint group 204. However, applications can interpret or use AllowedLayers, AllowedVias, MinClearance, MinNumCut, MinSpacing and MinWidth when in the Default constraint group 204 on a Net 202.

FIG. 3 shows details for an exemplary registry entry associated with a taper halo, typically one of many entries in the registry 104. FIG. 3 shows commonly used fields but is not intended to be limiting. For example, some fields are only valid under certain circumstances (e.g. scaling is not valid when the constraint value is not a number). And some fields have a suitable default value when not preset by the application developer 106. For example, by default many constraints do not enable "allowedParams" so obviously the applications do not register support for them and so the nominal value is nil (i.e., an empty field). Many of these values (e.g., from second column in FIG. 3) can be obtained from the database documentation 110 or may depend on how the Application Developer 106 wants to interpret certain constraint types. This example discusses the constraint type "TaperHalo" which is commonly used by Application Developers 106 to help override existing process rules when near an endpoint of routing a net. Nets connect objects and may have certain width or spacing rules which need to be relaxed when the objects being connected are smaller than the width or spacing rules. The TaperHalo constraint provides a distance within which the connected objects within routing applications may observe the relaxed TaperHalo rule set.

In FIG. 3 the field "showInApps" indicates which applications support this constraint. The Sample values include "PRE" and "SKILL", two conventional EDA applications. The field "categoryInApps" indicates that a constraint type belongs to a class of similar constraint types so a user interface may group them. The sample value is "Routing." The field "oaConstraintDefName" indicates which constraint type in the database is represented here. The sample value is "oaTaperHalo." The field "allowedValueTypes" indicates which value types the applications support on this constraint type and may be a subset of what the database supports. The sample value is nil, indicating the applications support all value types which the database supports.

The field "contextObjectType" indicates which design objects support this constraint type. The sample value is "Nets." (e.g., as in FIG. 2) The field "contextConstraintGroupType" indicates which design constraint groups support this constraint type. The Sample values are "InputTaper" and "OutputTaper." (e.g., as in FIG. 2) That is, the oaTaperHalo constraint is supported by applications only on Net objects and then only in input taper and output taper constraint groups. Specific values for each registry entry may be obtained from related documentation for the EDA database 110 or from the Application Developer 106.

The field "contextGUIName" indicates how GUIs Clients should refer to this constraint type. The sample value is "Taper Halo." The field "contextName" indicates how non-GUI Clients should refer to this constraint type. The sample value is "taperHalo." That is, when displayed by an interfaces this constraint can be called either "Taper Halo" (ref contextGUIName) or "taperHalo" (contextName) depending on if that interface is more graphical or more programmatic.

The field "GUIDescription" indicates text for a tool tip or similar GUI element to be used with this constraint. The sample value is "Specifies the offset around pin figures within which tapering must be performed according to the spacing and width constraints specified in the taper constraint group." The field "GUIImage" indicates a pointer to an image file representing this constraint type. The sample value is "dfII/ci/processRules/images/figTaperHalo.png." These two fields related to the GUI can add additional information that is very useful to the user including, for example, hints for specifying constraints that are complicated or warnings where the user may make an error.

The field "valueDisplay" indicates a scaling factor for values on this constraint type. A sample value is "UU", which stands for User Units that provide a convenient interface to users. For example, integral values in some registry field may correspond to microns in User Units through some convenient scaling. Another sample value is "Enum" to indicate that an integral value represents one item from an enumerated set.

The field "suggestedMaterials" indicates suggestion for materials (if this constraint type is associated with layers). The sample value is nil because this constraint type is not associated with any particular material. (For the constraint "minNumCuts", which specifies a minimum number of cuts for a via and is typically only valid on cut layers, a sample value for "suggestedMaterials" is "cut.")

The field "allowedParams" indicates a list of parameters which are supported on this constraint type. The sample value is nil because no additional parameters are supported for this constraint. (Some constraint types (such as minSpacing) require additional parameters such as how to measure the spacing (Manhattan or Euclidean) to be fully specified.)

Figure 4:
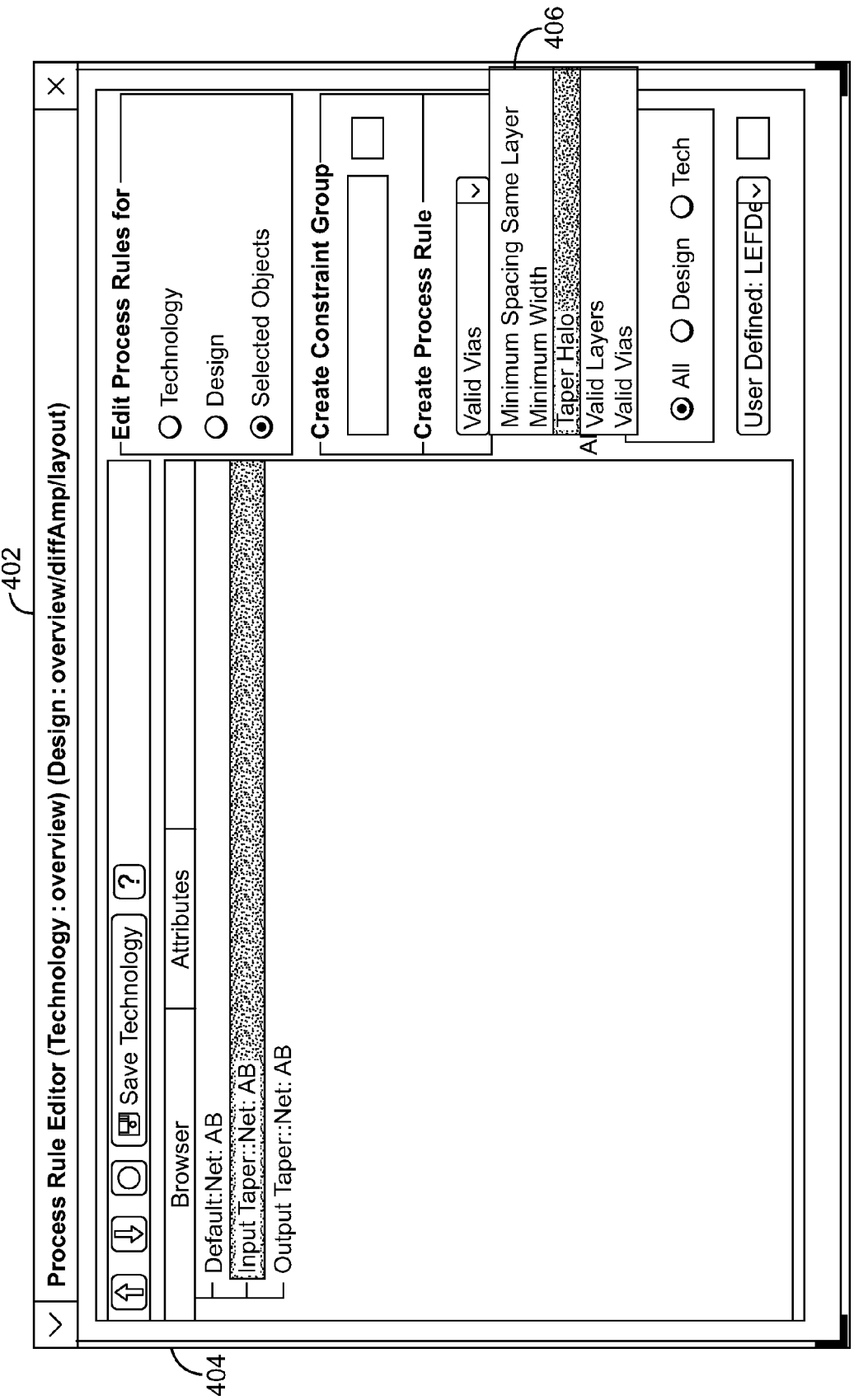
FIG. 4 shows an exemplary user GUI that reads the information from the registry according to an embodiment of the present invention.

FIG. 4 shows an example of a user GUI 402 that reads the information from the registry (e.g., for a Net object in this case). Using the information in FIG. 2, the left box 404 in the GUI is populated only with constraint groups with which an application associates Net objects. These constraint groups include the Default, Input Taper and Output Taper groups 404. In this case, the user has selected an input taper constraint group as active for editing 404. The registry 104 is consulted by the user GUI 108 to retrieve the list of constraints the application understands in the default constraint group on an input taper. The names shown in the pulldown menu 406 on the right of the figure are the registered contextGUIName values (from FIG. 3) for the available constraint types in FIG. 2 for the Net object and input taper constraint group combination.

Figure 5:
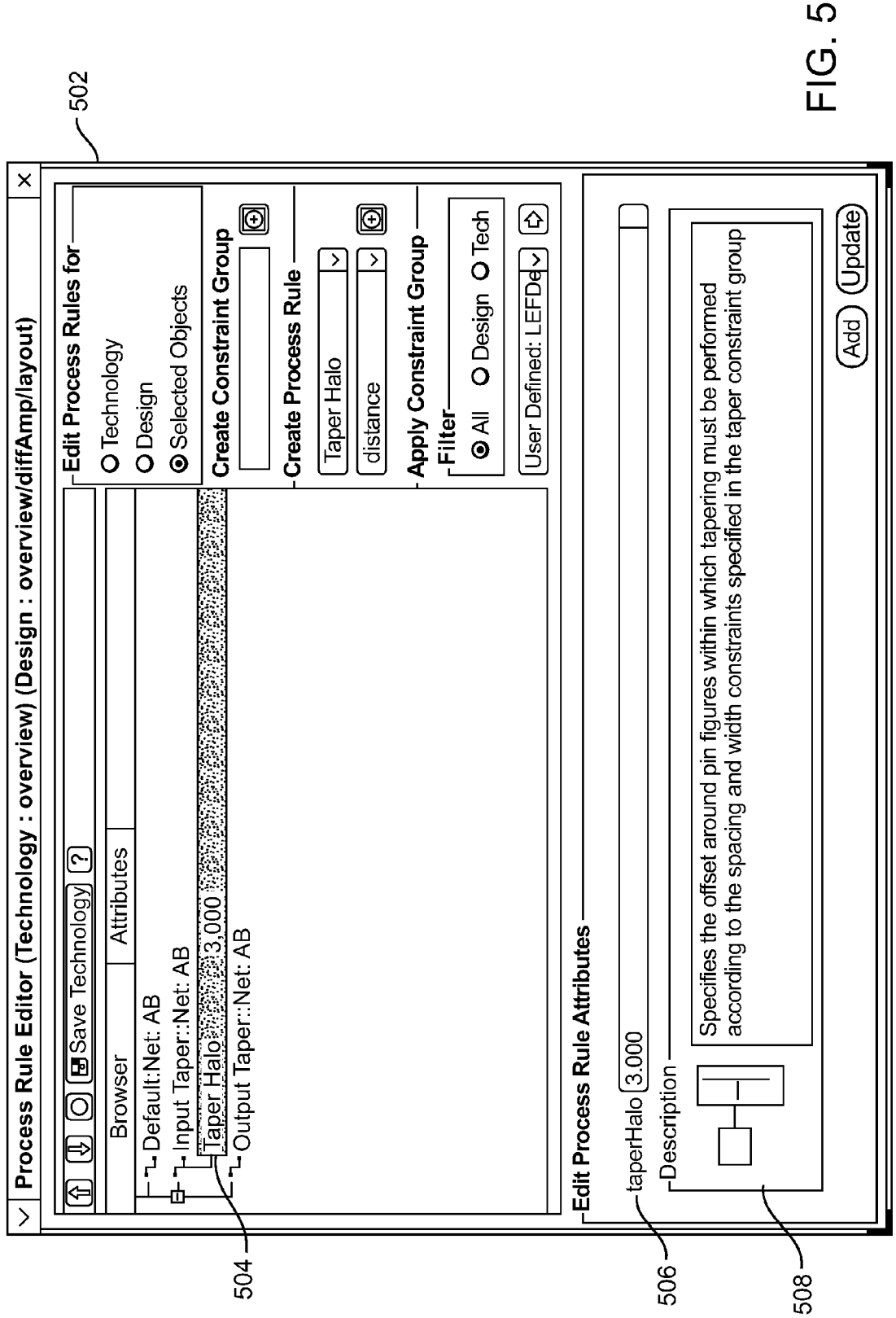
FIG. 5 shows another exemplary user GUI that reads the information from the registry according to an embodiment of the present invention.

FIG. 5 shows further how the information in FIG. 3 is used in a user GUI 502. In this figure more detailed information about a constraint of type Taper halo 504 is displayed. The Value (3.0) is shown 506 with appropriate scaling which is read from the registry. The picture and description 508 at the bottom of the panel are obtained from the registry as well.

Figure 6:
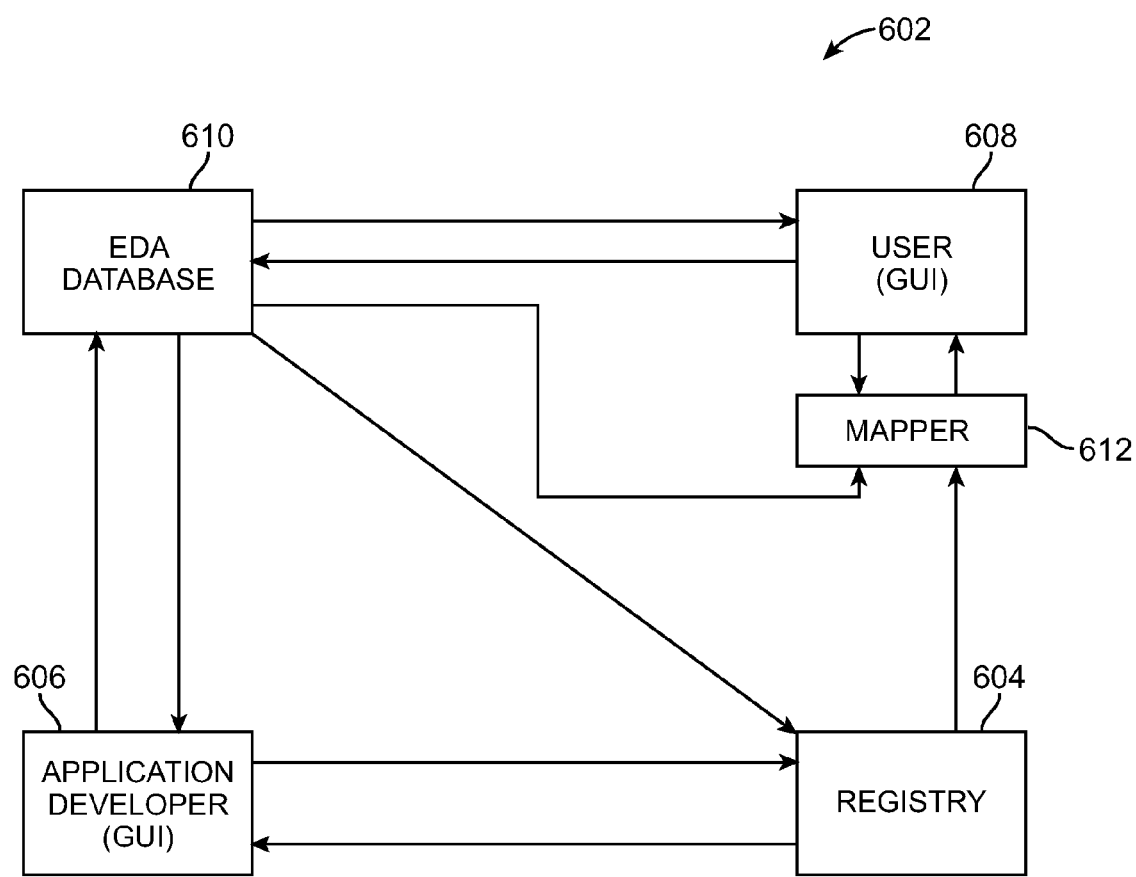
FIG. 6 shows another exemplary system for IC design according to an embodiment of the present invention.

In some operational settings a mapping unit may be used to help associate constraint groups with objects. Similarly as in FIG. 1, FIG. 6 shows an EDA system 602 that includes a registry 604, an application developer 606, a user 608, and an EDA database 610. Additionally a mapper 612 relates registry values to the IC design values to enhance the capabilities of the user's interface 608.

In some cases, the mapper 612 can provide more user friendly names (descriptions, etc) to constraint groups. For example from FIG. 2 we see a constraint group named "InterChild", which may only have meaning to those most familiar with how a OpenAccess (or any database) names its constraint groups. In this case the mapper could provide a more descriptive name such as "Group to Group" for such a constraint group.

Additionally the mapper 612 can relate information between user-interface items and the constraint groups associated with them. In the case of a net object this is a simple mapping. Users are very familiar with the concept of a net object and the database representation of such an object is transparently displayed in most user interfaces. For other compound or complex items the relationship between the user-interface item that the user sees in the user interface and the database storage for where that item's constraints are stored may be much more complicated. The mapper 612 allows applications to communicate in terms of user-interface items (e.g., what the user sees and selects in the GUI for characterizing constraints or other relationships between design objects) and returns the correct database constraint groups and objects that correspond to the user-interface items.

Figure 7:
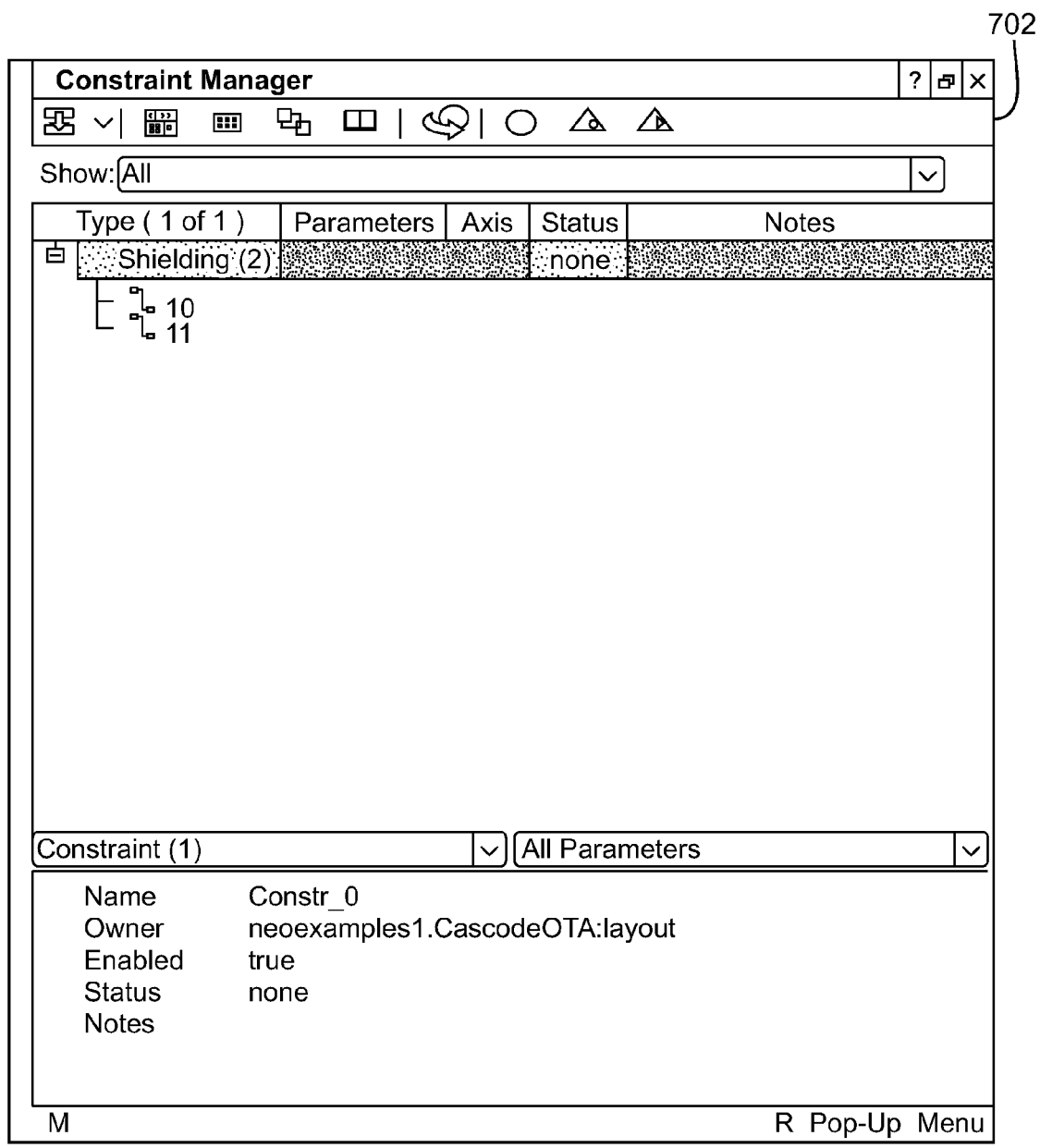
FIG. 7 shows an exemplary GUI associated with the mapper in FIG. 6.

FIG. 7 shows an exemplary GUI 702 for editing design data. This GUI 702 could be extended to include other views of the design (e.g., a schematic view of the IC). Here the "Constraint Manager" graphically shows relationships between design objects as user-interface items. These relationships demonstrate the mapper's capability to translate user-interface items with which the user interacts to underlying constraint groups and objects in the database. For some user-interface items this correspondence to database objects can be relatively clear. For example most applications expose users to nets that directly correspond to the underlying nets in the database. In this case, the user has selected a user-interface item for a relationship named "Constr_0" (from bottom right panel field "name"). To the user this user-interface item represents a shielding relationship between the two nets "10" and "11" and the GUI shows some of the attributes of this relationship such as Name, Owner, Enabled, Status, and Notes. In the database there may not be a single object that corresponds to this relationship. Instead the relationship could be captured as attributes on the individual nets. (For example, Net 10 has an attribute that says net 11 shields for it and net 11 has an attribute that says it is a shield for net 10). EDA Applications may abstract such complex relationships into items that users may more readily understand so as to facilitate data entry by the user.

In this case the user is familiar with the shielding relationship, which does not have a direct correspondence to a database object. The user is familiar with the concept of adding constraints to a shielding item but the registry may not properly interpret user-interface items that are not found in the database as database objects. In many cases, Applications and Database standards have defined the correct database locations where constraints should be represented so that the constraint is carried out as the user would logically expect. The mapper 612 is responsible for translating the user-interface items into database constraint groups and objects. In this case applications have dictated that the constraint group that behaves as the user would expect (i.e. constraints in this group will impact the shielding relationship between Nets 10 and 11) is the "Shielding" constraint on the Shielded Net (i.e. Net 10). The mapper's input would be "Shielding Relationship Constr_0" and its output would be the shielding constraint group on Net 10. Once the proper constraint groups are obtained the registry and user application function as previously specified.

Figure 8:
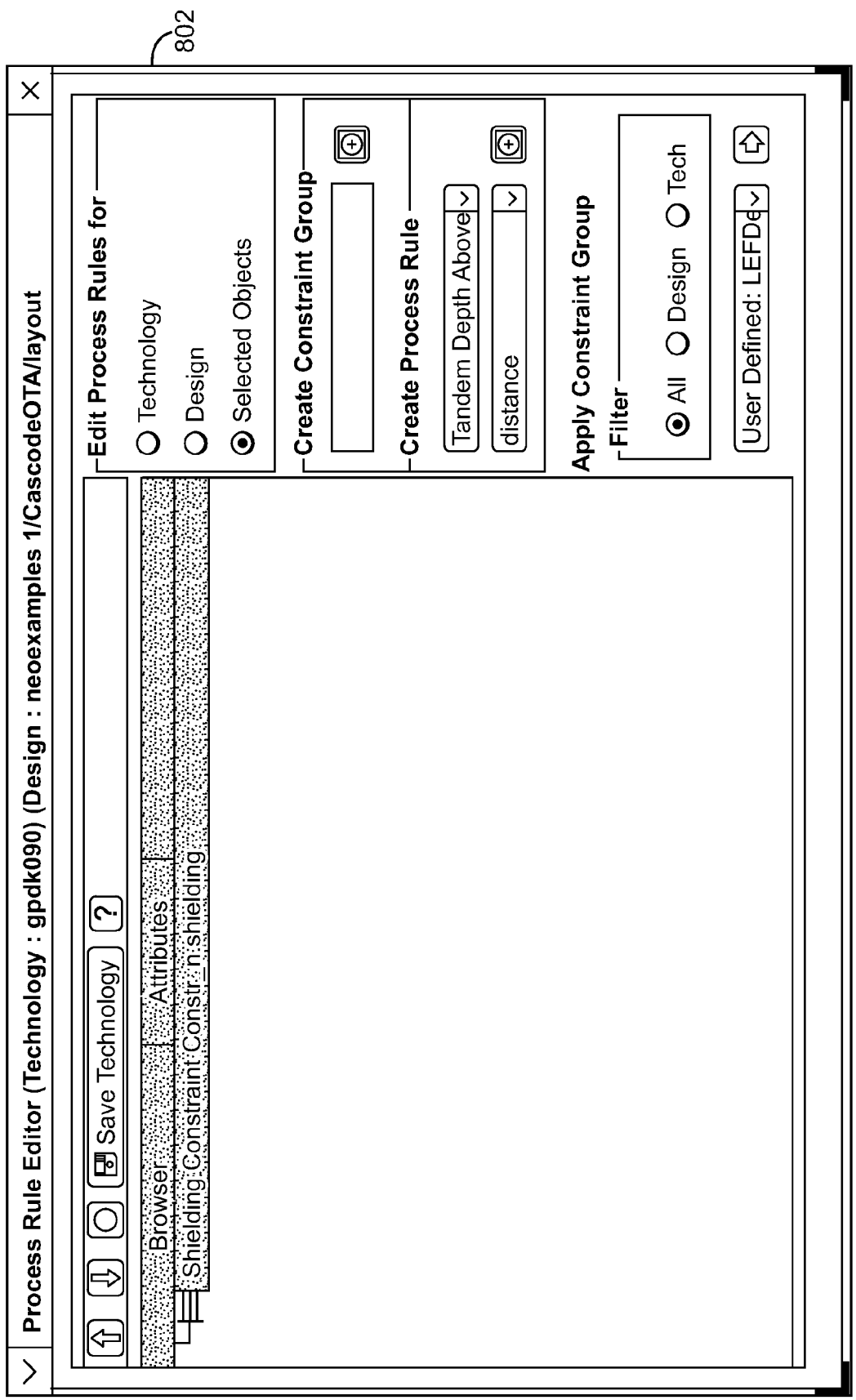
FIG. 8 shows another exemplary GUI associated with the mapper in FIG. 6.

FIG. 8 shows another exemplary GUI 802 associated with the registry functioning in conjunction with the mapper 612. On the left-hand side the GUI 802 is operating on a Shielding Relationship Constr_0 (from FIG. 7), and the remainder of the GUI 802 can be operated similarly as in FIGS. 4 and 5. The pull-down menu on the right-hand side shows Tandem Depth Above which is listed as "Shield Constraints" in FIG. 2. The constraint types listed in the GUI are retrieved from the registry for the constraint groups and objects provided from the mapper 612. (In this case the mapper provided a Shielding Constraint group on Net 10.) The same results could be achieved by the user directly editing a shielding constraint group on a net. However, without the more complex attributes above (which are all captured in the shielding relationship user-interface item) simply putting constraints on a net in a shielding constraint group may not accurately reflect the user's intent. Creating the shielding relationship item in FIG. 7 and allowing the user to edit constraints on that item has resulted in a fewer steps for the user to remember but has also required greater functionality in relating the constraints to the registry. The mapper 612 provides this functionality by translating these user-interface items into database objects and constraint groups. Similarly the mapper 612 can provide translations from/to user-interface items and objects that are in the database as such but may not be readily visible in the editor with which the user is editing the database.

As illustrated by FIGS. 7 and 8, the mapper 612 provides a flexible approach to relating constraint groups to user items which may not be database objects. Once the constraint groups and objects are obtained from the mapper, the registry is used as specified above. Note that in some configurations the mapper 612 may be considered as part of the registry 604 or the user interface 608.

At least some values for the results of the above-described methods can be output to a user or saved for subsequent use. For example, the registry values can be saved directly for applications in EDA design. Alternatively, some derivative or summary form of the results (e.g., averages, interpolations, etc.) can be saved for later use according to the requirements of the operational setting.

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., keyboard, display, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof. At least some values for the results of the method can be saved, either in memory (e.g., RAM (Random Access Memory)) or permanent storage (e.g., a hard-disk system) for later use.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

What is claimed is:

1. A method for registering constraints for Electronic Design Automation (EDA) of an Integrated Circuit (IC), comprising:
associating a constraint with values for constraint identification that identify the constraint in an IC design;
associating the constraint with values for constraint relationships that relate the constraint to at least one EDA application;
saving the constraint identification values and the constraint relationship values in a constraint registry element; and
using a computer for providing an interface to a user for accessing values of the constraint registry element.

2. A method according to claim 1, wherein the constraint identification values include values for at least one of a name, a description, an image, or a scale.

3. A method according to claim 1, wherein the constraint relationship values include values for at least one of an EDA application, a design object, or a design constraint group.

4. A method according to claim 1, further comprising: providing an interface to an EDA application developer for editing values in the constraint registry element.

5. A method according to claim 1, further comprising: providing an interface to an EDA database that stores the IC design for transferring values from the EDA database to the constraint registry element.

6. A method according to claim 1, further comprising: providing an interface between the user and an EDA database that stores the IC design for editing the IC design while accessing values from the constraint registry element.

7. A method according to claim 1, wherein providing the interface to the user includes organizing a display of constraints according to groupings of constraints and availability of editing by the user.

8. A method according to claim 1, further comprising: mapping user inputs to values of the constraint registry element and corresponding values of the IC design and displaying mapping results to the user.

9. A method according to claim 1, wherein the constraint relationship values include values for a constraint type associated with the constraint, values for a design object type that supports the constraint type, values for a constraint group type that includes one or more constraint types that support the design object type, and values for an EDA application that supports the constraint type.

10. A method according to claim 1, further comprising using values from the constraint registry element
to identify a design object associated with the constraint in the IC design,
to identify a design object type associated with the identified design object, and
to identify a constraint group type that includes one or more constraint types that support the design object type.

11. An apparatus for registering constraints for Electronic Design Automation (EDA) of an Integrated Circuit (IC), comprising:
a storage unit that stores a plurality of constraint registry elements for constraints in an IC design, each constraint registry element including values for constraint identification that identify the constraint in the IC design and constraint relationships that relate the constraint to at least one EDA application; and
a computer for executing computer instructions, wherein the computer includes computer instructions for providing an interface to a user for accessing values of the constraint registry elements.

12. An apparatus according to claim 11, wherein the constraint identification values include values for at least one of a name, a description, an image, or a scale.

13. An apparatus according to claim 11, wherein the constraint relationship values include values for at least one of an EDA application, a design object, or a design constraint group.

14. An apparatus according to claim 11, wherein the computer further includes computer instructions for providing an interface to an EDA application developer for editing values in the constraint registry element.

15. An apparatus according to claim 11, wherein the computer further includes computer instructions for providing an interface to an EDA database that stores the IC design for transferring values from the EDA database to the constraint registry element.

16. An apparatus according to claim 11, wherein the computer further includes computer instructions for providing an interface between the user and an EDA database that stores the IC design for editing the IC design while accessing values from the constraint registry clement.

17. An apparatus according to claim 11, wherein providing the interface to the user includes organizing a display of constraints according to groupings of constraints and availability of editing by the user.

18. An apparatus according to claim 11, wherein the computer further includes computer instructions for mapping user inputs to values of the constraint registry element and corresponding values of the IC design and displaying mapping results to the user.

19. An apparatus according to claim 11, wherein the computer includes a processor with memory for executing at least some of the computer instructions.

20. An apparatus according to claim 11, wherein the computer includes circuitry for executing at least some of the computer instructions.

21. A non-transitory computer-readable medium that stores a computer program for registering constraints for Electronic Design Automation (EDA) of an Integrated Circuit (IC), wherein the computer program includes instructions for:

associating a constraint with values for constraint identification that identify the constraint in an IC design;

associating the constraint with values for constraint relationships that relate the constraint to at least one EDA application;

saving the constraint identification values and the constraint relationship values in a constraint registry element; and providing an interface to a user for accessing values of the constraint registry element.

* * * * *

UNITED STATES PATENT AND TRADEMARK OFFICE
CERTIFICATE OF CORRECTION

| | | |
|---|---|---|
| PATENT NO. | : 7,945,890 B2 | Page 1 of 1 |
| APPLICATION NO. | : 11/932062 | |
| DATED | : May 17, 2011 | |
| INVENTOR(S) | : Regis Colwell et al. | |

It is certified that error appears in the above-identified patent and that said Letters Patent is hereby corrected as shown below:

In column 6, line 44, delete "Above" and insert -- Above, --, therefor.

In column 7, line 65, in Claim 4, delete "claim 1." and insert -- claim 1, --, therefor.

In column 8, line 67, in Claim 16, delete "clement." and insert -- element. --, therefor.

Signed and Sealed this
Twelfth Day of July, 2011

David J. Kappos
*Director of the United States Patent and Trademark Office*